United States Patent
Buhari

(10) Patent No.: US 11,545,824 B2
(45) Date of Patent: Jan. 3, 2023

(54) USB SHORT CIRCUIT PROTECTION

(71) Applicant: Texas Instruments Incorporated, Dallas, TX (US)

(72) Inventor: Riazdeen Buhari, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 184 days.

(21) Appl. No.: 16/157,293

(22) Filed: Oct. 11, 2018

(65) Prior Publication Data
US 2020/0119540 A1 Apr. 16, 2020

(51) Int. Cl.
*H02H 3/16* (2006.01)
*G06F 13/42* (2006.01)
*H02H 9/00* (2006.01)

(52) U.S. Cl.
CPC ............ *H02H 3/16* (2013.01); *G06F 13/4282* (2013.01); *H02H 9/004* (2013.01)

(58) Field of Classification Search
CPC ............ H02H 3/16; H02H 3/105; H02H 9/08; H02H 3/023; H02H 7/23; H02H 9/02; H02H 3/025; H02H 3/08; H02H 9/025; G06F 13/4288; G06F 2213/0042
See application file for complete search history.

(56) References Cited

U.S. PATENT DOCUMENTS

| | | | | |
|---|---|---|---|---|
| 4,104,544 A * | 8/1978 | Bradburn | ............... | H02H 3/087 327/482 |
| 5,198,957 A * | 3/1993 | Welty | ........................ | H02H 3/20 361/111 |
| 5,684,663 A * | 11/1997 | Mitter | ..................... | H02H 9/025 361/106 |
| 6,160,381 A * | 12/2000 | Peterzell | ................... | H02H 3/12 320/136 |
| 6,194,869 B1 * | 2/2001 | Peterzell | ............... | H02J 7/0031 320/136 |
| 6,275,395 B1 * | 8/2001 | Inn | ..................... | H03K 17/04123 363/60 |
| 6,529,355 B1 * | 3/2003 | Becker | ...................... | G01R 1/36 361/101 |
| 7,038,522 B2 * | 5/2006 | Fauh | ......................... | H02J 1/08 307/80 |
| 7,330,063 B2 * | 2/2008 | Ferianz | .................. | H04M 1/745 327/309 |
| 9,066,406 B1 * | 6/2015 | Xiong | .................... | H02M 3/156 |

(Continued)

*Primary Examiner* — Gustavo A Rosario-Benitez
(74) *Attorney, Agent, or Firm* — Ray A. King; Frank D. Cimino

(57) ABSTRACT

A power circuit with a first transistor, including a first terminal connected to a first node, a second terminal connected to an input node, and a control terminal connected to a first control node, and a second transistor, including a first terminal connected to the first node, a second terminal connected to an output node, and a control terminal connected to a second control node. A third transistor includes a first terminal connected to the first control node, a second terminal connected to a second node, and a control terminal, and a fourth transistor includes a first terminal connected to the output node, a second terminal connected to the second control node, and a control terminal connected to a third node. The power circuit also includes a current limiting circuit coupled between the second node and the third node.

21 Claims, 4 Drawing Sheets

(56) References Cited

U.S. PATENT DOCUMENTS

| | | | |
|---|---|---|---|
| 2005/0007711 A1* | 1/2005 | Liu | H02H 3/202 |
| | | | 361/90 |
| 2009/0009919 A1* | 1/2009 | Taylor | H02H 3/087 |
| | | | 361/75 |
| 2012/0060042 A1 | 3/2012 | Buhari et al. | |
| 2012/0327542 A1* | 12/2012 | Wang | H02H 3/20 |
| | | | 361/79 |
| 2013/0258530 A1* | 10/2013 | Nakahara | H02H 3/087 |
| | | | 361/18 |
| 2014/0049238 A1* | 2/2014 | Hu | G01R 19/00 |
| | | | 323/282 |
| 2014/0198423 A1* | 7/2014 | Anand | H02H 7/222 |
| | | | 361/93.9 |
| 2014/0362478 A1* | 12/2014 | Kuo | H02H 11/005 |
| | | | 361/18 |
| 2015/0277457 A1* | 10/2015 | Sakaguchi | H02H 7/10 |
| | | | 323/277 |
| 2016/0301235 A1* | 10/2016 | Okanoue | B60L 53/20 |
| 2017/0025844 A1* | 1/2017 | Creech | H02H 3/093 |
| 2018/0351448 A1* | 12/2018 | Igarashi | H02M 3/1584 |
| 2018/0375457 A1* | 12/2018 | Kitamura | H02M 7/53871 |
| 2019/0173274 A1* | 6/2019 | Fukae | H01M 10/48 |
| 2019/0220048 A1* | 7/2019 | Tomioka | H03K 17/166 |

* cited by examiner

USB SHORT CIRCUIT PROTECTION

BACKGROUND

Universal serial bus (USB) provides interconnection cables, connectors and protocols for communications and power supply between compatible electronic devices, such as desktop computers, automobile dashboard consoles and battery-powered portable devices, such as laptop computers, tablets, mobile phones, e-readers MP3 players and the like. USB ports are accessed using standardized USB cable connections to provide serial communications between devices, as well as electrical power transfer for charging and operating battery-powered peripheral devices. USB power delivery (USB-PD) and Type-C(USB-C) specifications describe delivery of higher power over USB cables and connectors to provide a universal power plug for devices that may accommodate charging at different voltages, for example, for fast or quick-charging capabilities. Power circuitry that delivers power from a source to a USB compatible device often includes a blocking transistor and a high side hot-swap transistor connected back to back between a power supply and the USB port connector. The on-state resistance (e.g., RDSON) of the blocking and hot-swap transistors is preferably low to reduce conduction losses for high power USB PD applications, particularly for fast charging operation at elevated voltage levels. USB power circuits are sometimes subjected to output short-circuit conditions, such as direct short-circuits between the voltage bus (e.g., VBUS) terminal and the ground (e.g., GND) terminal of the USB connector. The low RDSON high side hot-swap transistor must be discharged quickly when a fault is detected to protect the transistor.

SUMMARY

Described examples include a USB circuit and a power circuit therefore. The USB circuit includes an input node, an output node and the power circuit. The power circuit includes a first transistor, with a first terminal connected to a first node, a second terminal connected to an input node, and a control terminal connected to a first control node. The power circuit also has a second transistor with a first terminal connected to the first node, a second terminal connected to an output node, and a control terminal connected to a second control node. A third transistor includes a first terminal connected to the first control node, a second terminal connected to a second node, and a control terminal. The power circuit also a fourth transistor with a first terminal connected to the output node, a second terminal connected to the second control node, and a control terminal connected to a third node. The power circuit further includes a current limiting circuit coupled between the second node and the third node.

A short circuit protection method is described, which includes conducting a first current from a gate terminal of a blocking transistor through a resistor in response to detection of a short circuit condition at an output node, and turning a first control transistor on in response to a voltage across the resistor. The method further includes conducting a second current from the gate terminal of the blocking transistor through the first control transistor, through a current limiting resistor, and through a third resistor, while the first control transistor is on. The method also includes turning a second control transistor on to turn a hot-swap transistor off and disconnect the output node from the blocking transistor, in response to a voltage across the third resistor.

DETAILED DESCRIPTION

Figure 1:
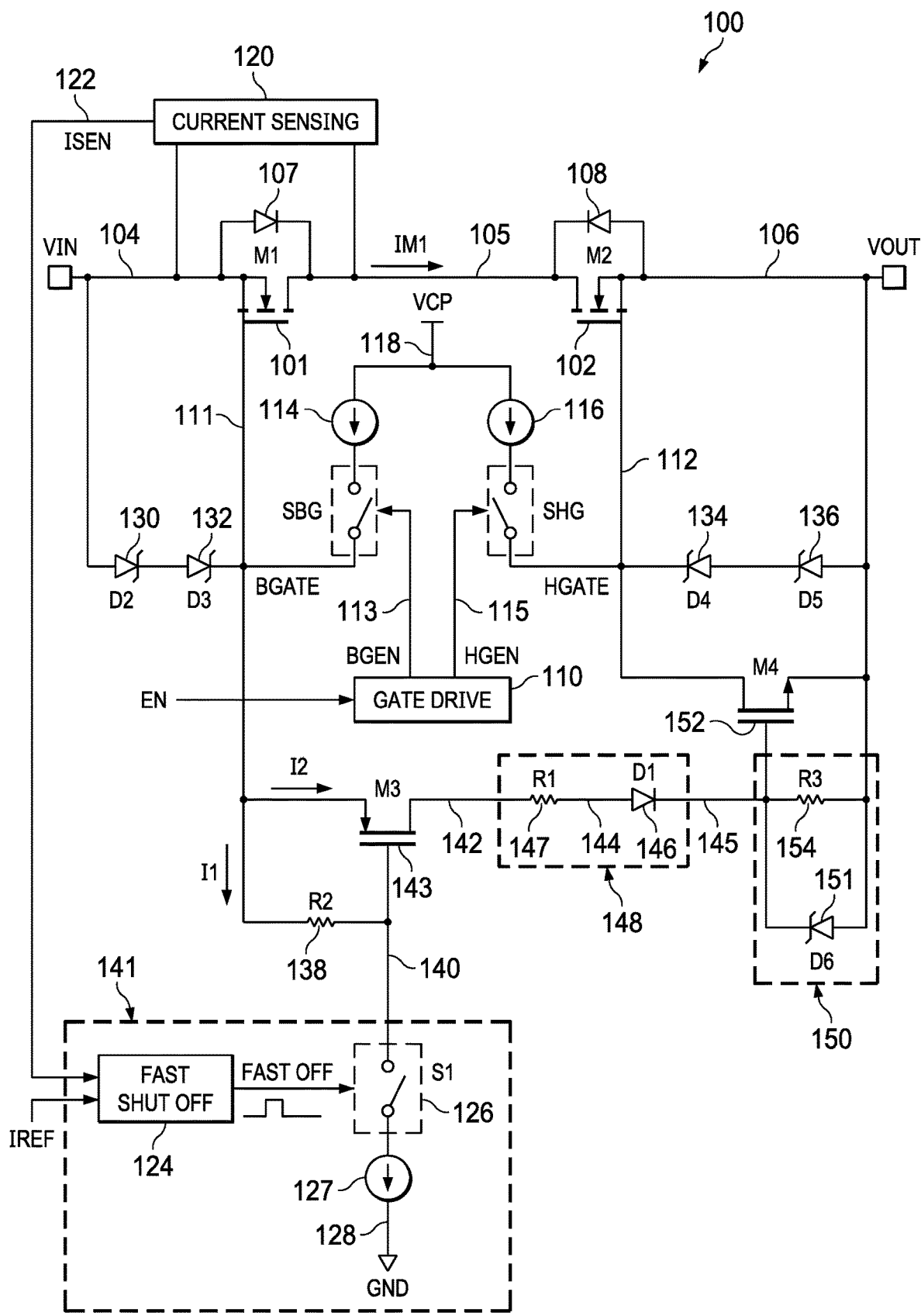
FIG. 1 is a schematic diagram of a short circuit protected USB power circuit.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Disclosed examples provide a method, USB systems and power circuits with a back-to-back transistor configuration and fast power down circuitry configured to turn off a high side hot-swap transistor using current conducted through a current limiting circuit from a blocking transistor control terminal. The disclosed examples can be used in a variety of system applications, including USB-PD compatible port controller power circuits with low on state resistance transistors to efficiently implement high voltage fast charging of a connected USB device. The disclosed examples facilitate fast turn off times to protect the high side hot-swap transistor during output short circuits or other fault conditions. Described examples, moreover, use current from the high capacitance gate terminal of a blocking FET to actuate a control transistor that turns off the high side FET for fast turn off operation. In addition, the described examples limit the gate terminal current flow to mitigate large voltage dips in the blocking FET gate voltage, and maintain adequate enhancement of the blocking FET to facilitate current sensing accuracy for control of the power circuit. In addition, described examples provide high-speed shut off of the high side hot-swap transistor independent of the output voltage, including output short-circuit conditions, using a cost effective gate-source, area efficient turn off device that can continue to hold the high side transistor off even when the output falls equal to or below GND potential.

FIG. 1 shows a power circuit 100 that includes a first transistor 101 (labeled M1) and a second transistor 102 (M2) connected back to back in series with one another. In this configuration, the first transistor 101 is referred to as a blocking transistor, and the second transistor 102 is referred to as a high side hot-swap transistor. The transistors 101 and 102 in this example are n-channel metal oxide semiconductor (e.g., NMOS) field effect transistors (FETs). Other types of transistors can be used in other implementations, such as bipolar transistors. The first transistor 101 is connected between an input node 104 and a first node 105. The input node 104 in one example is connected to receive an input voltage signal VIN, for example, from a power supply (not shown in FIG. 1). The first transistor 101 includes a first terminal (e.g., drain) that is connected to a first node 105, a second terminal (e.g., source) that is connected to the input node 104, and a control terminal (e.g., gate).

The second transistor 102 includes a first terminal (e.g., drain) connected to the first node 105, as well as a second terminal (e.g., source) connected to an output node 106, and a control terminal (e.g., gate). The first transistor 101 in this example includes a body diode 107, with an anode connected to the input node 104 and a cathode connected to the first node 105. The second transistor 102 includes a body diode, with an anode connected to the output node 106, and a cathode connected to the first node 105. In operation of the power circuit 100, the output node 106 is configured to provide an output voltage signal VOUT to a load, such as a USB compatible device connected to a USB port (not shown in FIG. 1).

The example power circuit 100 in FIG. 1 includes a gate drive circuit 110 that operates according to an enable signal EN. The gate control terminal of the first transistor 101 is connected to a first control node 111. The first transistor 101 operates according to a gate-source voltage established by a blocking transistor gate control voltage signal BGATE at the first control node 111. The gate control terminal of the second transistor 102 is connected to a second control node 112. The second transistor 102 operates according to a gate-source voltage established by a hot-swap transistor gate control voltage signal HGATE at the second control node 112. The gate drive circuit 110 has a first output 113 that provides a blocking gate enable signal BGEN that selectively connects a first current source 114 to the first control node 111. The signal BGEN in one example operates a blocking gate switch SBG (e.g., a transistor, not shown) connected between the current source 114 and the first control node 111. The gate drive circuit 110 has a second output 115 that provides a hot-swap gate enable signal HGEN that operates a hot-swap gate switch SHG to selectively connect a second current source 116 to the second control node 112. The current sources 114 and 116 in one example are connected to a supply voltage 118 from a charge pump circuit (not shown) to receive a charge pump voltage VCP.

The power circuit 100 in one example also includes a current sensing circuit 120 with inputs connected to the input node 104 and the first node 105 to sense voltage across the first transistor 101. In one example, the current sensing circuit 120 includes a sense FET (not shown) with source and drain terminals connected across the source and drain of the first transistor 101. In operation, when the enhancement mode first transistor 101 is substantially enhanced by proper gate source voltage established by the signal BGATE, the sense FET in the current sensing circuit 120 conducts a current that is proportional to a current IM1 flowing in the first transistor 101 (and hence the current flowing through the second transistor 102). This sense FET current in one example is used to generate a current sense signal ISEN. The current sensing circuit 120 provides the current sense signal (e.g., a voltage signal) at an output 122.

A fast shut off circuit 124 in this example compares the current sense signal ISEN with a reference signal IREF that represents a desired maximum current flowing in the transistors 101 and 102. The fast shut off circuit 124 generates a pulse output signal FAST OFF to initiate shutoff of the high side hot-swap transistor 102 if the amplitude of the current sense signal ISEN exceeds the reference signal IREF. The rising edge of the pulse signal FAST OFF turns on a switch 126 (e.g., labeled 51 in FIG. 1) to connect shutoff circuitry via a current source 127 to a reference node 128 (e.g., GND). Any suitable switch can be used, such as a transistor, as the switch 126.

The power circuit 100 further includes Zener diodes 130 (e.g., labeled D2) and 132 (e.g., labeled D3) connected in series with one another between the input node 104 and the first control node 111. An anode of the diode 130 is connected to the input node 104, and a cathode of the diode 130 is connected to the anode of the diode 132. The cathode of the diode 132 is connected to the first control node 111. In addition, the power circuit 100 includes Zener diodes 134 (e.g., D4) and 136 (e.g., D5) connected in series with one another between the second control node 112 and the output node 106. The diode 134 has a cathode connected to the second control node 112 and an anode connected to the cathode of the diode 136. The anode of the diode 136 is connected to the output node 106.

The power circuit 100 includes shutoff circuitry to selectively turn off one or both of the first and second transistors 101, 102 in order to protect one or both of these transistors in a fault condition. For example, a short-circuit condition may electrically short the output node 106 to the reference node 128. The shutoff circuitry turns off the high side hot-swap transistor 102 in response to the FAST OFF pulse signal from the fast shut off circuit 124 when the sensed current flowing in the transistors 101 and 102 exceeds a limit that corresponds to the reference signal IREF.

The example shutoff circuitry in FIG. 1 includes a resistor 138 (e.g., labeled R2) connected between the first control node 111 and a third control node 140. The switch 126 includes a current path coupled between the third control node 140 and the reference node 128. In operation, when the FAST OFF signal is high, the switch 126 is closed, and the resistor 138 is electrically connected between the first control node 111 and the reference node 128. In this state, the resistor 138 conducts a non-zero first current I1. The fast shut off circuit 124, the switch 126, and the current source 127 provide a first circuit 141 that provides the pulse signal FAST OFF to turn the switch 126 on, and thus to turn the third transistor 143 on.

The shutoff circuit also includes a third transistor 143 (e.g., labeled M3 in FIG. 1). The third transistor 143 is connected between the first control node 111 and a second node 142. In the illustrated example, the third transistor 143 is a p-channel FET (e.g., PMOS). The third transistor 143 includes a first terminal (e.g., source) connected to the first control node 111, a second terminal (e.g., drain) connected to the second node 142, and a control terminal (e.g., gate) connected to the third control node 140. When the first current I1 flows through the resistor 138 (e.g., in response to closure of the switch 126), a gate-source voltage of the third transistor 143 is established across the resistor 138. The voltage across the resistor 138 turns the third transistor 143 on, and the third transistor 143 conducts a second current I2 from the first control node 111 to the second node 142.

The shutoff circuitry in this example uses current from the first control node 111 (e.g., from the capacitance of the gate of the first transistor 101) to selectively turn off the second transistor 102. In this regard, a low on-state resistance (e.g., low RDSON) first transistor 101 will have a corresponding relatively large gate capacitance at the first control node 111. Once the first transistor 101 is turned on and sufficiently enhanced, the gate capacitance will be sufficiently charged to provide the current I1 to turn on the third transistor 143 in response to the FAST OFF signal, and to also supply the second current I2 used to shut off the hot-swap high side transistor 102.

The shut off circuitry in FIG. 1 also includes a current limiting circuit 148 with a resistor 147 (e.g., labeled R1) that is connected between the second node 142 and a fourth node 144. The resistor 147 operates to limit the second current I2 that flows through the third transistor 143 from the first control node 111. The example current limiting circuit 148 also includes a diode 146 (e.g., labeled D1) coupled in series with the resistor 147 between the second node 142 and a third node 145. In another example, the diode 146 can be omitted, and the resistor 147 is connected between the second node 142 and the third node 145. The resistor 147 in FIG. 1 includes a first terminal connected to the second node 142, and a second terminal connected to the fourth node 144. The diode 146 in this example includes an anode connected to the fourth node 144, and a cathode connected to the third node 145. The current limiting circuit 148 is thus coupled (e.g., indirectly or directly connected) between the second node 142 and the third node 145.

The example power circuit 100 also includes a circuit 150, with another resistor 154 (e.g., labeled R3) connected in parallel with another Zener diode 151 (e.g., labeled D6) between the third node 145 and the output node 106. The shutoff circuitry also includes a fourth transistor 152 (e.g., labeled M4) coupled between the second control node 112 and the output node 106. In the illustrated example, the fourth transistor 152 is an n-channel FET (e.g., NMOS). The fourth transistor 152 includes a first terminal (e.g., source) connected to the output node 106, a second terminal (e.g., drain) connected to the second control node 112, and a control terminal (e.g., gate) connected to the third node 145. In operation when the third transistor 143 is turned on in response to the FAST OFF pulse signal, the second current I2 flows through the third transistor 143, the current limiting circuit 148, and the resistor 154. The current I2 flowing through the resistor 154 creates a non-zero gate-source voltage of the fourth transistor 142, and turns the transistor 142 on.

Figure 2:
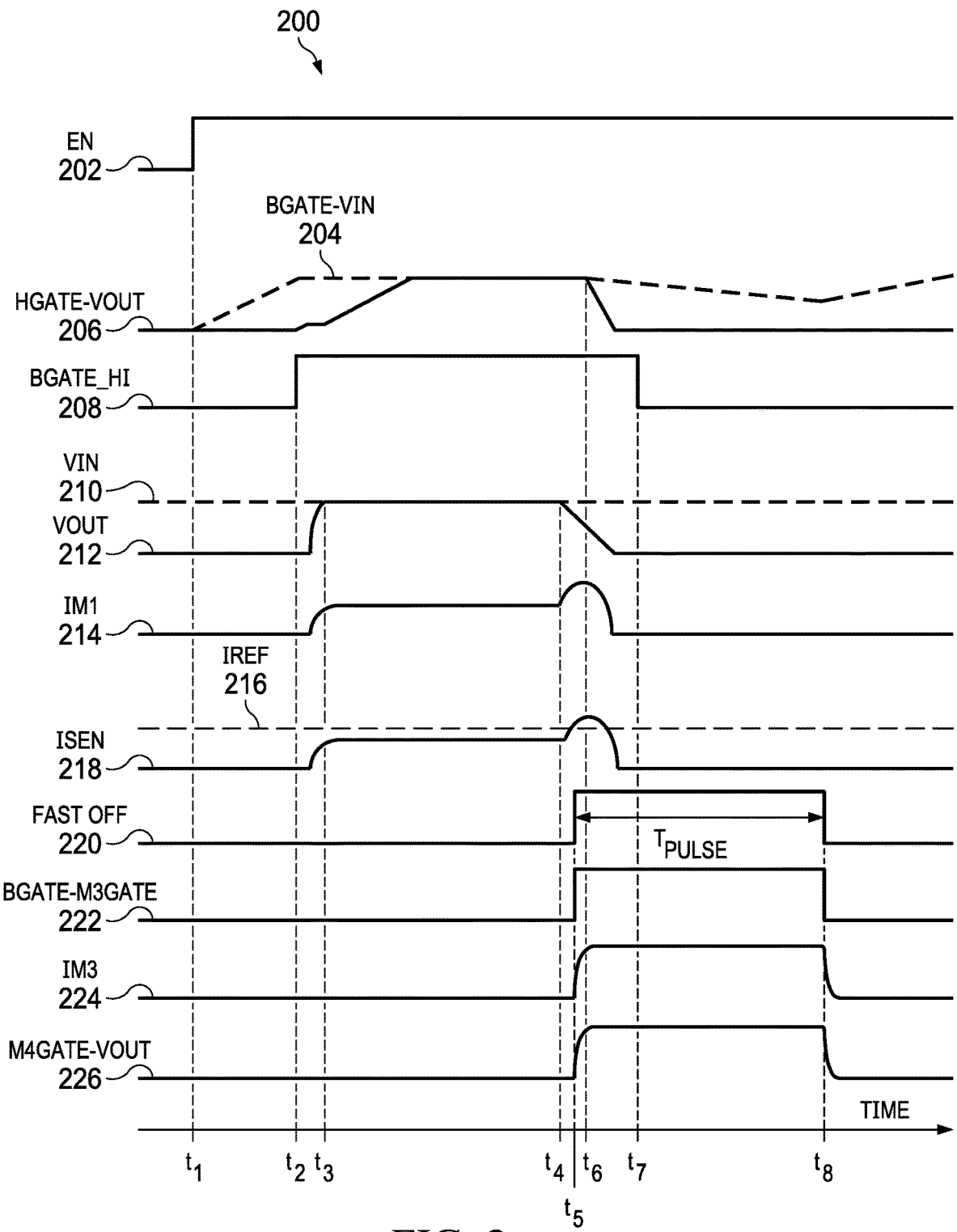
FIG. 2 is a signal diagram of signal waveforms in the power circuit of FIG. 1.

Referring also to FIG. 2, a signal diagram 200 shows signal waveforms as a function of time during operation of the example power circuit 100 of FIG. 1. As mentioned, lowering the RDSON of the second transistor 102 to reduce conduction losses increases the drive requirements to turn the transistor 102 off quickly. The power circuit 100 of FIG. 1 facilitates short circuit protection with by quickly turning the high side hot-swap transistor 102 off in response to a detected fault condition. In an example USB application, the disclosed power circuit 100 can be used to turn off a high side hot-swap FET with an RDSON of approximately 2 mΩ and gate capacitance of approximately 2 nF within approximately 200 ns or less. The circuitry provides drive current from the gate capacitance of the first transistor 101 for shut off and thus does not require oversizing of the shut off control transistor 152 and provides space savings.

The diagram 200 includes a curve 202 that shows the enable signal EN with a rising edge at time $t_1$ during circuit start up to initiate a power up sequence. The gate drive circuit 110 activates the blocking gate enable signal BGEN at or shortly after $t_1$ to connect the first current source 114 to the first control node 111. A curve 204 shows the gate-source voltage of the first transistor 101 (as the difference between the blocking gate-source control voltage and the input voltage BGATE-VIN), and a curve 206 that shows the gate-source control voltage of the second transistor 102 (e.g., HGATE-VOUT). The blocking transistor gate-source control voltage curve 204 begins to rise from zero at $t_1$, due to charging from the current source 114, and the first transistor 101 is fully enhanced at $t_2$.

A curve 208 in FIG. 2 shows a signal BGATE_HI that represents the gate drive circuit 120 determining that the first transistor 101 is enhanced by proper charging of the gate at the first control node 111. The diagram 200 also shows an input voltage curve 210 (VIN at the input node 104) and an output voltage curve 212 (VOUT at the output node 106). A curve 214 shows the blocking transistor current IM1, a curve 216 shows the reference signal IREF, and a curve 218 shows the current sense signal ISEN at the output 122 of the sensing circuit 120. A curve 220 in FIG. 2 shows the pulse output signal FAST OFF from the fast shut off circuit 124. A curve 222 shows the gate-source voltage of the third transistor 143 (e.g., labeled BGATE-M3GATE in FIG. 2). A curve 224 shows the second current I2 (FIG. 1) flowing through the third transistor 143 (e.g., labeled IM3 in FIG. 2). A curve 226 shows the gate-source voltage of the fourth transistor 152 (e.g., labeled M4GATE-VOUT in FIG. 2).

The enable signal EN goes high at time $t_1$ in FIG. 2. In one example, the gate drive circuit 110 turns the gate of the blocking transistor 101 on (e.g., BGEN asserted) first at $t_2$ by asserting the BGEN signal to cause the current source 114 to ramp up the gate voltage BGATE. The gate drive circuit 110 turns the gate of the high side hot-swap transistor 102 on after the blocking transistor 101 is fully enhanced. This ensures the gate capacitance of the transistor 101 is fully charged up to later supply current for fast shutoff, and also to full enhancement of the channel of the transistor 101 to facilitate accurate current sensing by the sensing circuit 120. When properly enhanced, the transistor 101 operates as a resistor. The sensed voltage across the drain and source of the enhanced transistor 101 provides a reliable indication of the current IM1.

The gate drive circuit 110 monitors the gate voltage BGATE to determine if the first transistor 101 is fully enhanced (e.g., BGATE_HI=1) before turning on the gate voltage HGATE via the HGEN signal. This ensures the gate voltage BGATE is fully charged up providing current sensing when the second transistor 102 is enhanced. The gate drive circuit 110 asserts the signal BGATE_HI at $t_2$ indicating that the first transistor 101 is fully enhanced. After $t_2$, the gate voltage HGATE starts turning the transistor 102 on.

The gate-source control voltage HGATE-VOUT of the second transistor 102 (curve 206) rises to a threshold voltage, and then rises to its final full enhancement voltage after the output voltage (curve 212) reaches a steady-state value just below the input voltage (curve 210) at $t_3$. The current source 116 charges the gate-drain capacitance of the second transistor 102 and the output voltage VOUT starts ramping up between $t_2$ and $t_3$. At $t_3$ the output voltage VOUT is very close to VIN where both the first transistor 101 and the second transistor 102 are in linear region. The current IM1 starts to flow through the first transistor 101 as the output voltage VOUT starts ramping up and then settles to a steady state value based on load current IL.

The current sensing circuit 120 monitors the transistor current IM1 and generates the signal ISEN that is proportional to the transistor current IM1. The sense signal ISEN is continuously compared against a reference current IREF. During normal operation ISEN is always less than IREF.

An output short circuit condition begins at $t_4$ in the example of FIG. 2. At $t_4$, the output voltage VOUT starts ramping down, and the transistor current IM1 increases due to the short circuit fault condition. The increase in the transistor current IM1 causes ISEN to exceed the IREF threshold triggering FAST OFF signal to go high at $t_5$. The fast shut off circuit 124 generates the FAST OFF signal as a one-shot pulse with a minimum duration $T_{pulse}$ set in one example to ensure the gate voltage HGATE is fully discharged.

The rising edge of the pulse signal FAST OFF closes the switch 126 and the resulting current flow I1 creates a gate-source voltage for the third transistor 143. The non-zero gate-source voltage turns the third transistor 143 on and provide gate charge to the fourth transistor 152 via the second current flow I2 from the first control node 111 (e.g., from the gate capacitance of the first transistor 101). The current I2 charges M4GATE which in turn turns on the fourth transistor 152. When the transistor 143 is on, the fourth transistor 152 is driven using the current I2 from the gate of the transistor 101. The transistor 152 collapses the gate-source voltage HGATE-VOUT below the threshold voltage of the transistor 102, and the transistor 152 operates as a pull down transistor to turn the second transistor 102 off.

The charge transfer from the gate voltage B GATE to M4GATE is controlled by the resistance of the resistor 147 and the one-shot timer duration $T_{pulse}$. This ensures the gate voltage BGATE does not collapse immediately and limits the voltage droop in one example to approximately 2 V, while ensuring 13 V enhancement for a 15 V output voltage operating level. This helps to maintain the first transistor 101 enhanced to facilitate accurate current sensing capability of the first transistor 101 to generate an accurate sense signal ISEN. In certain examples, the resistance of the resistor 147 and the duration $T_{pulse}$ of the FAST OFF signal from the fast shut off circuit 124 are designed to provide an intelligent trade-off between fast shut off for the second transistor 102 in response to a detected fault condition, and maintaining adequate enhancement of the first transistor 101 to facilitate accurate current sensing. These parameters can be varied according to the size of the transistors 101 and 102, the amount of fault current tolerance associated with a given design of the high side hot-swap transistor 102, typical operating levels (e.g., output voltage) of the power circuit 100, and other operating parameters.

In operation, the diode 146 (D1) prevents reverse current flowing from the output voltage VOUT to the first control node 111 as the power path is bi-directional. The pull down operation of the fourth transistor 152 turning on discharges the gate voltage at the second control node 112 (HGATE) at $t_6$ to turn the second transistor 102 off. In one example, both the third transistor 143 and the fourth transistor 152 are on during the one-shot pulse duration $T_{pulse}$ to ensure the gate voltage HGATE is completely discharged under all conditions. The shutoff circuitry in the example of FIGS. 1 and 2 circuitry continues to operate even if the output voltage VOUT=0 V or less. In one example, the shutoff circuitry operates to turn off the second transistor 102, while the first transistor 101 remains on, since the body diode 107 will conduct even if the first transistor 101 is turned off.

At $t_7$ in FIG. 2, the BGATE_HI goes low indicating that the first transistor 101 is not fully enhanced. Thereafter, if the enable signal EN remains asserted (e.g., active high), the power circuit 100 automatically re-starts once the fault condition is discontinued at time $t_8$. The power circuit 100 advantageously uses stored charge on the gate voltage BGATE (e.g., first control node 111) to provide the gate drive for the fourth transistor 152, thereby making it possible to keep the second transistor 102 off even when the output voltage VOUT falls all the way to 0 V or even goes negative. When the output short is detected, the signal FAST OFF signal goes high for a small duration to turn the third transistor 143 on. The third transistor 143 conducts a percentage of charge from the gate voltage BGATE to drive the fourth transistor 152 gate, which in turn turns off the second transistor 102. The circuit tree controls the voltage dip or droop of the gate voltage BGATE by the current limiting circuit 148, including the resistor 147, as well as the one-shot timer pulse duration $T_{pulse}$ for which the FAST OFF signal is high. This ensures the gate of the first transistor 101 discharges only by a controlled amount (e.g., approximately 2 V for a transistor 101 having a full enhancement at approximately 13 V). In this manner, the fast shut off capability does not adversely impact the current limit sensing accuracy of the enhanced blocking transistor 101 and the associated current sensing circuit 120. The 146, if included in the current limiting circuit 148, prevents reverse current flowing from the output node 106 to the first control node 111, as the power path is bi-directional. In addition, the power circuit 100 provides fast shut off operation independent of the output voltage VOUT and the gate voltage HGATE of the second transistor 102. In addition, particularly for low RDSON transistor implementations, the operation of the first transistor 101 for current sensing is not disturbed during the output short circuit condition. Rather, the gate voltage BGATE remains stable enough to ensure full enhancement of the first transistor 101, and the relatively large gate capacitance provides a storage capacitor used to help turn on the fourth transistor 152 for fast shut off operation.

Figure 3:
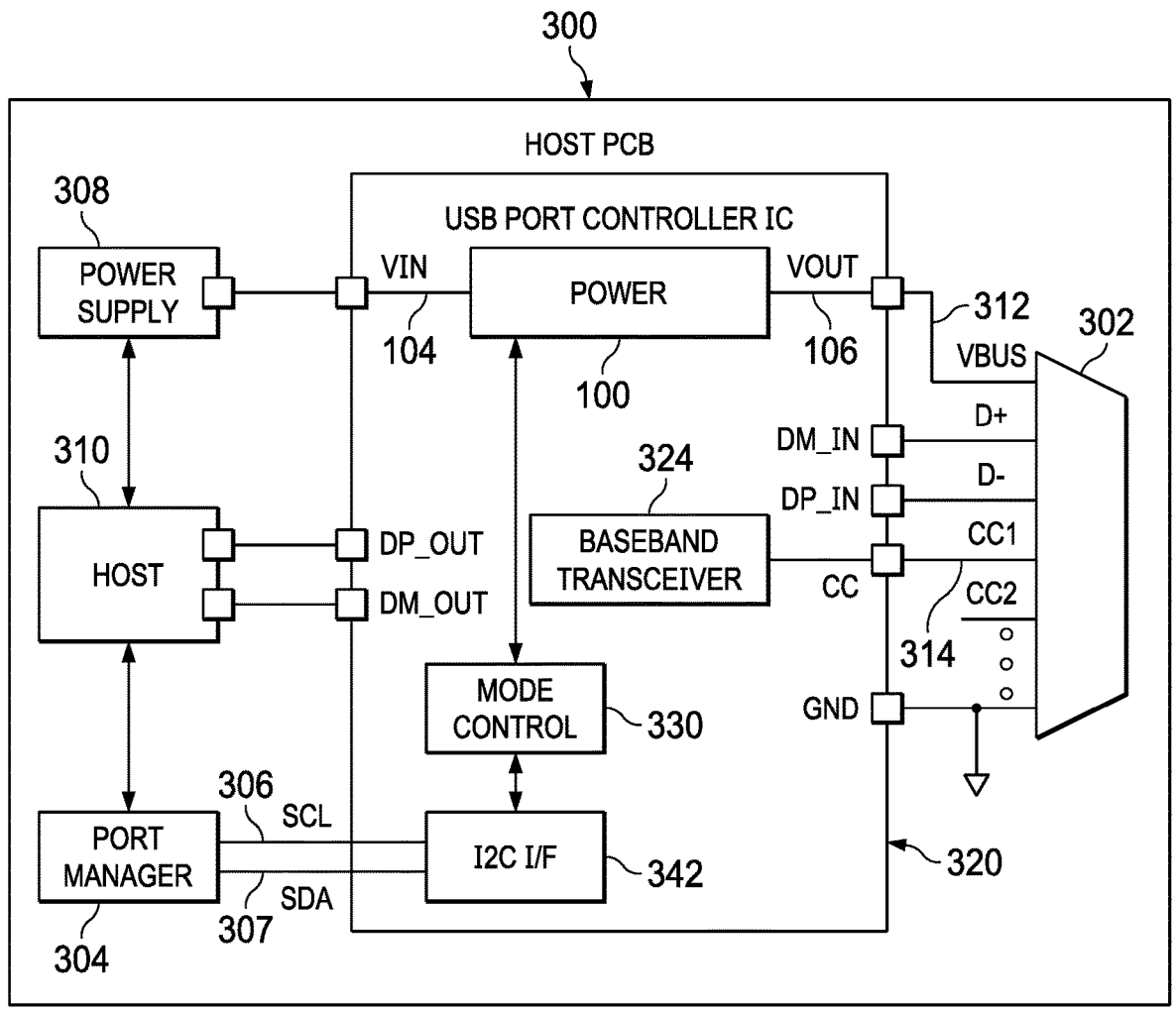
FIG. 3 is a schematic diagram of a host printed circuit board with a host processor and a USB port controller ICs to interface with USB compatible devices.

FIG. 3 shows a universal serial bus (USB) or system with a power circuit 100 as described above in connection with FIG. 1. The USB system in FIG. 3 includes a host printed circuit board (PCB) 300, with a USB connector 302, a port manager circuit 304 with serial clock and data lines 306 and 307 (e.g., respectively labeled SCL and SDA in FIG. 3), as well as a power supply 308, a host processor 310, and a USB port controller integrated circuit (IC) 320. The port controller IC 320 includes an input node 104 configured to receive an input voltage signal VIN from the power supply 108, as well as an output node 106 configured to provide an output voltage signal VOUT to a USB port connector 302. The nodes 104 and 106 operate as generally described above in connection with FIG. 1. The power circuit 100 in the port controller IC 320 operates as described above in connection with FIG. 1. The power circuit 100 in this example provides the output voltage VOUT to provide a voltage bus signal (e.g., labeled VBUS) to the USB connector 302 via a circuit trace or connection 312 of the host PCB 300. The controller IC 320 includes further terminals (e.g., pins or pads) for additional connections to the USB connector 302.

In one example, the host PCB 300 provides DP_OUT and DM_OUT connections from the controller IC 320 to the host processor 310. The USB controller 320 also provides DM_IN and DP_IN terminals to connect to D+ and D− lines of the connector 302 that allow the host processor 310 to send and receive data packets. The controller IC 320 also provides a ground terminal GND for connection to a ground line of the USB cable 302. In certain examples, the port controller 320 implements communications with a connected USB device using a baseband transceiver circuit 324 along one or more configuration channel (CC) lines 314 (e.g., CC1, CC2, etc.) to exchange data with the port manager circuit 304. The port controller IC 320 includes a communications interface circuit 342 to communicate with a port manager circuit 304 over a communications connection in normal mode. In the illustrated example, an I2C serial bus connection is provided, including a serial clock line 306 (SCL) and a serial data line (SDA). In one example, the port manager 304 communicates with the host processor 310, and directs or controls operation of the connected USB port controller 320 for messaging exchange along the communications connection. In another implementation, the port manager circuit 304 is included in the host circuit 310. In yet another implementation, the port manager circuit 304 and the port controller circuit are in the same IC. In yet another implementation, multiple port controllers are in the same IC. The port controller 320 in this example provides an I2C interface circuit 342, which is selectively powered down during low power mode operation. The port manager circuit 304 in one example operates as a communication master, and the port controller IC 320 operates as a slave in a master-slave communications configuration using the I2C bus lines 306 and 308 to communicate with one another. The port controller 320 also includes a low power mode control circuit 330 coupled with the communications interface circuit 342. This allows the port manager circuit 304 to set one or more operating modes of the power circuit 100 (e.g., fast charging, slow charging, etc.), for example, based on protocol message exchanges between the USB port controller IC 320 and a connected USB device to determine intelligent charging levels. The power circuit 100 operates during charging to protect the high side transistor (e.g., the second transistor 102 in FIG. 1) in response to detected output short circuits (e.g., VBUS shorted to GND) or other fault conditions as described above.

Figure 4:
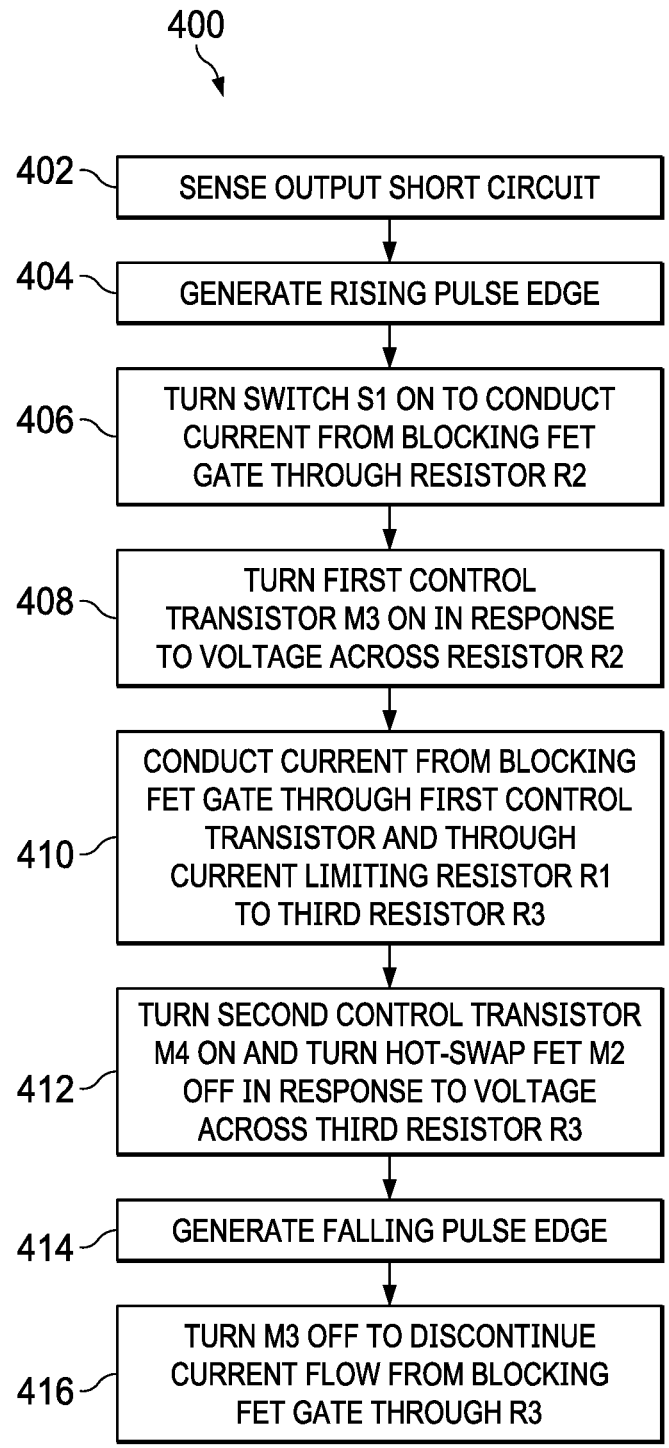
FIG. 4 is a flow chart of a short circuit protection method.

FIG. 4 shows a short circuit protection method 400. The method 400 can be used in conjunction with the example power circuit 100 in USB power delivery applications, such as the USB system of FIG. 3. Although described below in the context of the example power circuit 100, the method 200 can be used in other power circuit implementations in any power application. While the exemplary method 400 is depicted and described in the form of a series of acts or events, it will be appreciated that the various methods of the disclosure are not limited by the illustrated ordering of such acts or events except as specifically set forth herein. In this regard, except as specifically provided hereinafter, some acts or events may occur in different order and/or concurrently with other acts or events apart from those illustrated and described herein, and not all illustrated steps may be required to implement a process or method in accordance with the present disclosure.

The method 400 begins at 402 with sensing an output short circuit. In the example of FIG. 1, the current sensing circuit 120 senses the current IM1 and generates the sense signal ISEN. The example method 200 further includes generating a rising pulse edge at 404. For example, the fast shut off circuit 124 generates the rising edge of the FAST OFF pulse signal in response to the detected output voltage short circuit. The method 400 continues at 406 with conducting a current from a blocking FET gate through a resistor. The FAST OFF signal closes the switch 126 in FIG. 1 to conduct the first current I1 from the gate terminal 111 of a blocking transistor 101 through the resistor 138 in response to the rising edge of the FAST OFF pulse signal.

The method 400 continues at 408 with turning a first control transistor on in response to the voltage across the resistor. In the example of FIG. 1, the voltage across the resistor 138 turns the third transistor 143 on. At 410, the method also includes conducting current from the blocking transistor gate through a first control transistor and through a current limiting resistor to a third resistor. In the example circuit 100, the transistor 143 conducts the second current I2 from the gate terminal 111 of the blocking transistor 101 through the current limiting resistor R1 (and through any included diode 146), and through the third resistor 154.

The method 400 also includes turning a second control transistor on and turning a hot-swap transistor off at 412 in response to the voltage across the third resistor. In the example of FIG. 1, the current I2 creates a voltage across the third resistor 154 turns the second control transistor 152 on and turns the second transistor 102 off. The example method 400 also includes generating a falling edge of the pulse at 414 (e.g., the falling edge of the one-shot pulse signal FAST OFF after the on period $T_{pulse}$), and turning the transistor 143 off by the falling pulse edge opening the switch 126 to discontinue the currents I1 and I2 from the gate of the first transistor 101.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

What is claimed is:

1. A power circuit, comprising:
   a first transistor having a first source, a first drain, and a first gate, the first source coupled to an input voltage terminal;
   a second transistor having a second source, a second drain, and a second gate, the second drain coupled to the first drain, and the second source coupled to an output voltage terminal;
   a third transistor having a third source, a third drain, and a third gate, the third source coupled to the first gate;
   a current sensing circuit coupled between the first source and the first drain, the current sensing circuit providing a current sense output signal;
   a shutoff circuit having a shutoff input and a shutoff output, the shutoff input coupled to the current sense output, and the shutoff output coupled to the third gate and the first gate;
   a fourth transistor having a fourth source, a fourth drain, and a fourth gate, the fourth drain coupled to the second gate, and the fourth source coupled to the second source; and
   a current limiting circuit coupled between the third drain and the fourth gate, wherein the fourth transistor turns on responsive to current flowing through the third transistor.

2. The power circuit of claim 1,
   wherein the first transistor is an n-channel transistor; and
   wherein the second transistor is an n-channel transistor.

3. The power circuit of claim 1, wherein the first transistor is configured to turn on responsive to a signal at the first gate, and the second transistor is configured to turn off responsive to the first transistor turning on.

4. The power circuit of claim 1, the current limiting circuit comprising:
   a resistor having a first resistor terminal and a second resistor terminal, the first resistor terminal coupled to the third drain; and
   a diode having an anode and a cathode, the anode coupled to the second resistor terminal and the cathode coupled to the fourth gate.

5. The power circuit of claim 4, wherein the third transistor is a p-channel transistor and the resistor is a first resistor, the power circuit further comprising:
a second resistor connected between the first gate and the third gate; and
a switch coupled between the third gate and a reference voltage node.

6. The power circuit of claim 5, further comprising a circuit configured to produce a pulse to instruct the switch to couple the reference voltage node to the third gate.

7. The power circuit of claim 5, wherein the fourth transistor is an n-channel transistor, the anode is a first anode, and the cathode is a first cathode, the power circuit further comprising:
a third resistor coupled between the fourth source and the fourth gate; and
a Zener diode having a second anode and a second cathode, the second anode coupled to the fourth source and the second cathode coupled to the fourth gate.

8. The power circuit of claim 7,
wherein the first transistor is an n-channel transistor; and
wherein the second transistor is an n-channel transistor.

9. The power circuit of claim 4, wherein the resistor is a first resistor, the anode is a first anode, the cathode is a first cathode, and the fourth transistor is an n-channel transistor, the power circuit further comprising:
a second resistor coupled between the fourth source and the fourth gate; and
a Zener diode having a second anode and a second cathode, the second anode coupled to the fourth source and the second cathode coupled to the fourth gate.

10. The power circuit of claim 9,
wherein the first transistor is an n-channel transistor; and
wherein the second transistor is an n-channel transistor.

11. The power circuit of claim 4, wherein the third transistor is a p-channel transistor and the resistor is a first resistor, the power circuit further comprising:
a second resistor coupled between the third source and the third gate; and
a switch having a current path between the third gate and a reference voltage node.

12. The power circuit of claim 11, further comprising a circuit configured to produce a pulse to instruct the switch to couple the reference voltage node to the third gate.

13. The power circuit of claim 11, wherein the fourth transistor is an n-channel transistor, the anode is a first anode, and the cathode is a first cathode, the power circuit further comprising:
a third resistor coupled between the fourth source and the fourth gate; and
a Zener having a second anode and a second cathode, the second anode coupled to the fourth source and the second cathode coupled to the fourth gate.

14. The power circuit of claim 4, wherein the fourth transistor is an n-channel transistor the anode is a first anode, and the cathode is a first cathode, the power circuit further comprising:
a second resistor coupled between the fourth source and the fourth drain; and
a Zener diode having a second anode and a second cathode, the second anode coupled to the fourth source and the second cathode coupled to the fourth gate.

15. A circuit, comprising:
a first transistor having a first source, a first drain, and a first gate, the first source coupled to an input;
a second transistor having a second source, a second drain, and a second gate, the second drain coupled to the first drain, and the second source coupled to an output;
a third transistor having a third source, a third drain, and a third gate, the third source coupled to the first gate;
a current sensing circuit coupled between the first source and the first drain, the current sensing circuit providing a current sense output signal;
a shutoff circuit having a shutoff input and a shutoff output, the shutoff input coupled to the current sense output, and the shutoff output coupled to the third gate and the first gate;
a fourth transistor having a fourth source, a fourth drain, and a fourth gate, the fourth drain coupled to the second gate and the fourth source coupled to the output; and
a current limiting circuit coupled between the third drain and the fourth gate, wherein the fourth transistor turn on responsive to current flowing through the third transistor.

16. The circuit of claim 15, wherein the current limiting circuit comprises a resistor and a diode coupled in series, with the resistor coupled to the third drain.

17. The circuit of claim 16,
wherein the resistor has a first resistor terminal and a second resistor terminal, the first resistor terminal coupled to the third drain; and
wherein the diode has an anode and a cathode, the anode coupled to the second resistor terminal and the cathode coupled to the fourth gate.

18. The circuit of claim 15, wherein the third transistor is a p-channel transistor, the power circuit further comprising:
a resistor coupled between the third source and the third gate; and
a switch having a current path coupled between the third gate and a reference voltage node.

19. The circuit of claim 15,
wherein the first transistor is an n-channel transistor; and
wherein the second transistor is an n-channel transistor.

20. A method, comprising:
conducting a first current from a gate of a first transistor through a first resistor in response to detection of a short circuit condition at an output;
conducting, by a second transistor, in response to a voltage across the first resistor;
while the second transistor is conducting, conducting a second current from the gate through the second transistor, through a second resistor, and through a third resistor; and
in response to a voltage across the third resistor:
conducting, by a third transistor, to cause a fourth transistor not to conduct; and
disconnecting the output from the first transistor.

21. The method of claim 20, wherein conducting the first current from the gate through the first resistor comprises:
conducting, by a switch, in response to detection of the short circuit condition; and
while the switch is conducting, conducting the first current from the gate through the switch and the first resistor.

* * * * *